United States Patent
Sheng

(10) Patent No.: US 6,632,482 B1
(45) Date of Patent: *Oct. 14, 2003

(54) PLASMA IMMERSION ION IMPLANTATION PROCESS

(75) Inventor: Terry Tienyu Sheng, San Jose, CA (US)

(73) Assignee: Varian Semiconductor Equipment Associates, Inc., Gloucester, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/697,321

(22) Filed: Aug. 19, 1996

Related U.S. Application Data

(60) Continuation of application No. 08/242,917, filed on May 16, 1994, now abandoned, which is a division of application No. 08/059,036, filed on May 7, 1993, now Pat. No. 5,354,381.

(51) Int. Cl.[7] .................. C23C 14/18; C23C 14/48; C23C 14/58; H05H 1/24
(52) U.S. Cl. .................. 427/523; 427/527; 427/530; 427/535; 427/569; 118/723 E
(58) Field of Search .................. 427/523, 526, 427/527, 530, 535, 569, 570, 574, 578, 579; 204/192.15, 192.25; 118/723 E

(56) References Cited

U.S. PATENT DOCUMENTS

| | | | | |
|---|---|---|---|---|
| 3,471,316 A | * | 10/1969 | Manuel | |
| 3,479,269 A | * | 11/1969 | Byrnes, Jr. et al. | |
| 3,732,158 A | * | 5/1973 | Przybyszewshi et al. | |
| 3,988,955 A | * | 11/1976 | Engel et al. | 427/530 |
| 4,463,255 A | * | 7/1984 | Robertson et al. | 250/251 |
| 4,570,106 A | * | 2/1986 | Sohval et al. | 315/111.81 |
| 4,764,394 A | * | 8/1988 | Conrad | 427/525 |
| 4,925,542 A | * | 5/1990 | Kidd | 204/192.31 |
| 4,937,205 A | * | 6/1990 | Nakayama et al. | 427/569 |
| 5,015,493 A | | 5/1991 | Gruen | |
| 5,126,163 A | * | 6/1992 | Chan | 427/531 |
| 5,136,171 A | * | 8/1992 | Leung et al. | 250/492.2 |
| 5,206,180 A | * | 4/1993 | Yoshida | 437/4 |
| 5,286,676 A | * | 2/1994 | Kruger et al. | 437/190 |
| 5,289,010 A | * | 2/1994 | Shohet | 250/492.21 |
| 5,296,272 A | * | 3/1994 | Matossian | 427/523 |
| 5,306,408 A | * | 4/1994 | Treglio | 427/580 |
| 5,310,452 A | * | 5/1994 | Doki | 427/570 |
| 5,330,800 A | * | 7/1994 | Schumacher | 427/523 |
| 5,354,381 A | * | 10/1994 | Sheng | 118/723 E |
| 5,374,456 A | * | 12/1994 | Matossian et al. | 427/570 |
| 5,458,927 A | * | 10/1995 | Malaczynski et al. | 427/529 |
| 5,476,691 A | * | 12/1995 | Komovopoulos et al. | 427/527 |

OTHER PUBLICATIONS

Kirk–Othmer Encyclopedia of Chemical Technology, 3rd ed., Supplemental volume (Alchol Fuels to Toxicology), p. 605, 1984 (No month).*

* cited by examiner

Primary Examiner—Marianne Padgett
(74) Attorney, Agent, or Firm—Fish & Neave

(57) ABSTRACT

Implantation process for cold cathode plasma immersion ion implantation ($C^2PI^3$) without a continuous plasma using very short high voltage, low duty cycle ionization pulses, in conjunction with a synchronously produced electron flow to neutralize positively charged wafer surfaces.

21 Claims, 9 Drawing Sheets

PLASMA IMMERSION ION IMPLANTATION PROCESS

RELATED U.S. APPLICATION

This application is a continuation of application Ser. No. 08/242,917, filed May 16, 1994, now abandoned, which is a division of commonly assigned application Ser. No. 08/059,036, filed May 7, 1993, now U.S. Pat. No. 5,354,381. The subject matter of the present invention also is related to the disclosure in commonly assigned U.S. patent application Ser. No. 08/844,353, filed Mar. 3, 1992, now abandoned, which application is incorporated herein by reference. In addition, this invention relates to a simultaneously filed application, "Charge Monitor for High Potential Pulse Current Dose Measurement Apparatus and Method," inventors: T. Sheng, C. B. Cooper III, S. Felch and C. E. Van Wagoner, now U.S. Pat. No. 5,572,038.

FIELD OF THE INVENTION

This invention relates to process for doping of semiconductor materials by ion implantation with particular application to shallow junction devices.

BACKGROUND OF THE INVENTION

Modern electronic devices are based on semiconductor materials. A semiconductor has a crystalline structure in which very few electrons are mobile so that the intrinsic conductivity is too low to be useful as an electronic device. It is known to add small amounts of certain types of impurity to the crystal lattice to provide current carriers. The process of adding those impurities is known as "doping". The earliest technique for doping was accomplished by surrounding a semiconductor wafer with a gas comprising the dopants to be implanted and raising the temperature high enough to permit diffusion of the impurity atom into the lattice structure.

As the demand increased for more precise control over spatial uniformity and concentration of dopants, a device known as an ion implanter became the usual tool for adding the necessary impurity to a crystal. These implanters are large complex devices having very precise control of a dopant ion beam energy, position and scan rate. Very recently, for shallow junction formation, it has been recognized that the raster scan ion implanter has limitations at low energy beam conditions, under 10 KV, especially where dose and production rate, i.e. wafer throughput, requirements are high. Another method known as $PI^3$ (Plasma Immersion Ion Implantation) is being studied because the dose rate is high at lower energy and the equipment is inexpensive. Prior $PI^3$ methods employed a continuous plasma in the vacuum chamber.

In an earlier filed application, Ser. No. 844,353, dated Mar. 3, 1992, assigned to the same assignee, in which this inventor is a co-inventor, the $PI^3$ concept is improved by use of variable duty cycle ion accelerating pulses in conjunction with a cylindrical target mounted on a plasma chamber wall. Although this earlier application was an improvement in shallow junction, low energy high current implantation, there are several problems with that approach. Even when the electrode behind the wafer was essentially completely shielded from ion bombardment, unintended impurities due to plasma etching were present in the chamber and were being implanted. Also, large particles were being formed in the plasma and on the wafer surface.

The object of this invention is to overcome the prior art $PI^3$ contamination and particle problem and at the same time enable high yield manufacturing of shallow junction implantations without breakdown of any thin dielectric.

A secondary object is to provide inexpensive, high throughput apparatus for $PI^3$ of a semiconductor, having adequate uniformity and implant dose control.

SUMMARY OF THE INVENTION

A method of accomplishing $PI^3$ using a pair of power supplies and very short ionization negative pulses applied to the primary cathode underlying the wafer in conjunction or followed by short ionization pulses applied to a second cathode which is facing toward the primary (wafer) electrode to provide neutralizing electrons.

The on-time and the duty cycle of the primary cathode ionization pulses are made to be short enough so that no particles can grow in the $BF_3$ plasma. The neutralizing electrons necessary to protect the dielectric are provided by the secondary cathode.

DETAILED DESCRIPTION OF THE INVENTION

The prior art $PI^3$ process of Conrad as described in U.S. Pat. No. 4,764,94 employ a so called hot cathode process which continuously maintains a plasma to generate positive ions and applies pulses of negative voltage to accelerate the ions toward the workpiece. The earlier $PI^3$ work of Cheung et al at Berkeley and the work at the Varian labs also operated a continuous electron cyclotron resonance (ECR) produced plasma discharge in $BF_3$ gas and employed a highly negative pulse to the primary cathode behind the wafer to accelerate positive ions to the wafer. I have discovered that use of a continuously produced plasma causes: (1) significant concentrations of impurities to be etched from the chamber and to be implanted in the wafer; and (2) formation of large particles to be deposited on the wafer surface. Experiments show that a continuous $BF_3$ plasma discharge contains highly reactive species which etch the exposed surfaces in the chamber as well as the wafer. Also, the particles, of mostly silicon, grow continuously and deposit on the surface.

I have discovered that it is now possible to use a process known as a cold cathode discharge to obtain the desired implantation but to avoid both of these problems. The cold cathode process relies on secondary emission of electrons to ionize the gas. Specifically, without a continuous plasma in the chamber, by using a highly negative pulse, a plasma will be created which is only in place when the pulse is on.

For a six inch wafer, I prefer a primary pulse on the order of 10 microseconds with a low duty cycle, i.e. 1%. However, so long as the primary pulse width is less than the order of 15 milliseconds, I have determined that no significant particle formation occurs. Shorter pulses will provide the benefits of my invention for smaller diameter wafers. For a continuous plasma, after 15 milliseconds, the particles seem to reach a critical diameter and they form and deposit on the surface in great concentrations.

I also employ a very short high voltage pulse to a second cold cathode for electron source to produce neutralizing electrons which flow to the workpiece to prevent oxide breakdowns.

Figure 1:
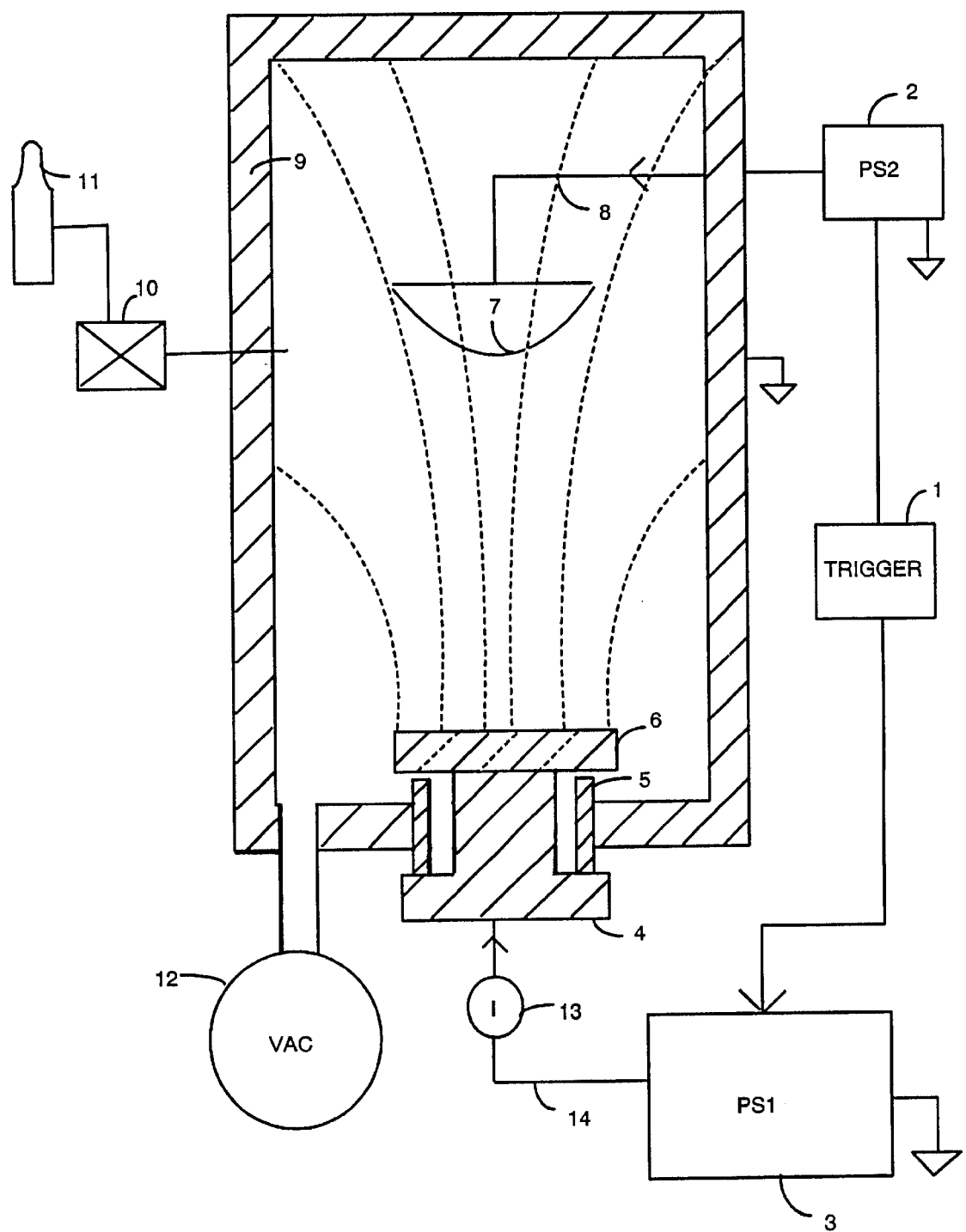
FIG. 1 is a block diagram schematic of the inventive $PI^3$ system.

With reference to FIG. 1, a chamber 9 of aluminum alloy is evacuated by a pump 12 to pressures on the order of 1 mTorr, while $BF_3$ is introduced into the chamber via mass flow controller 10 from bottle 11. A wafer 6 is mounted to an electrode 4 in a wall of chamber 9 which electrode is shielded electrically by annular cylindrical walls 5 which are electrically connected to the chamber wall 9. PS1, the high voltage power supply 3 for providing a pulse on order of negative 5 KV is connected to the electrode 4 via conductor 14. A current sensor 13 is in the line 14. In the chamber, an electron source, e.g. a cold cathode 7 is shown centrally located with respect to the electrode 4 but removed from the electrode 4 to provide a uniform flow of electrons to the wafer which is responsive to a large negative pulse applied to the electron source, e.g. a cold cathode 7 from the second power supply PS2, i.e. on the order of negative 2 KV. The two power supplies PS1 and PS2 are each timed in respect to a single trigger source so that they can have their pulses precisely synchronized.

Since there is no pre-ionization of the gas, the pulsed negative voltage applied to the electrode 4 on the order of 5 KV; creates electric fields lines which travel from the face of the electrode 4 to the uniform potential chamber wall. These lines are controlled by the geometry of the housing.

Since electrons are lighter and very mobile, and since the field lines all focus down to the face of electrode 4, the electrons in close proximity to the wafer 6 start stripping from the gas upon application of the pulse. This leaves the more slow moving positive ions so formed in the region. These ions are then accelerated and implanted into the wafer. The uniformity of dose implant is on the order of 2% over a 6 inch wafer for 1 sigma distribution.

The short duration ionization pulses do not completely eliminate chamber wall etching so that impurities do form but only during the pulse on-time.

Figure 2:
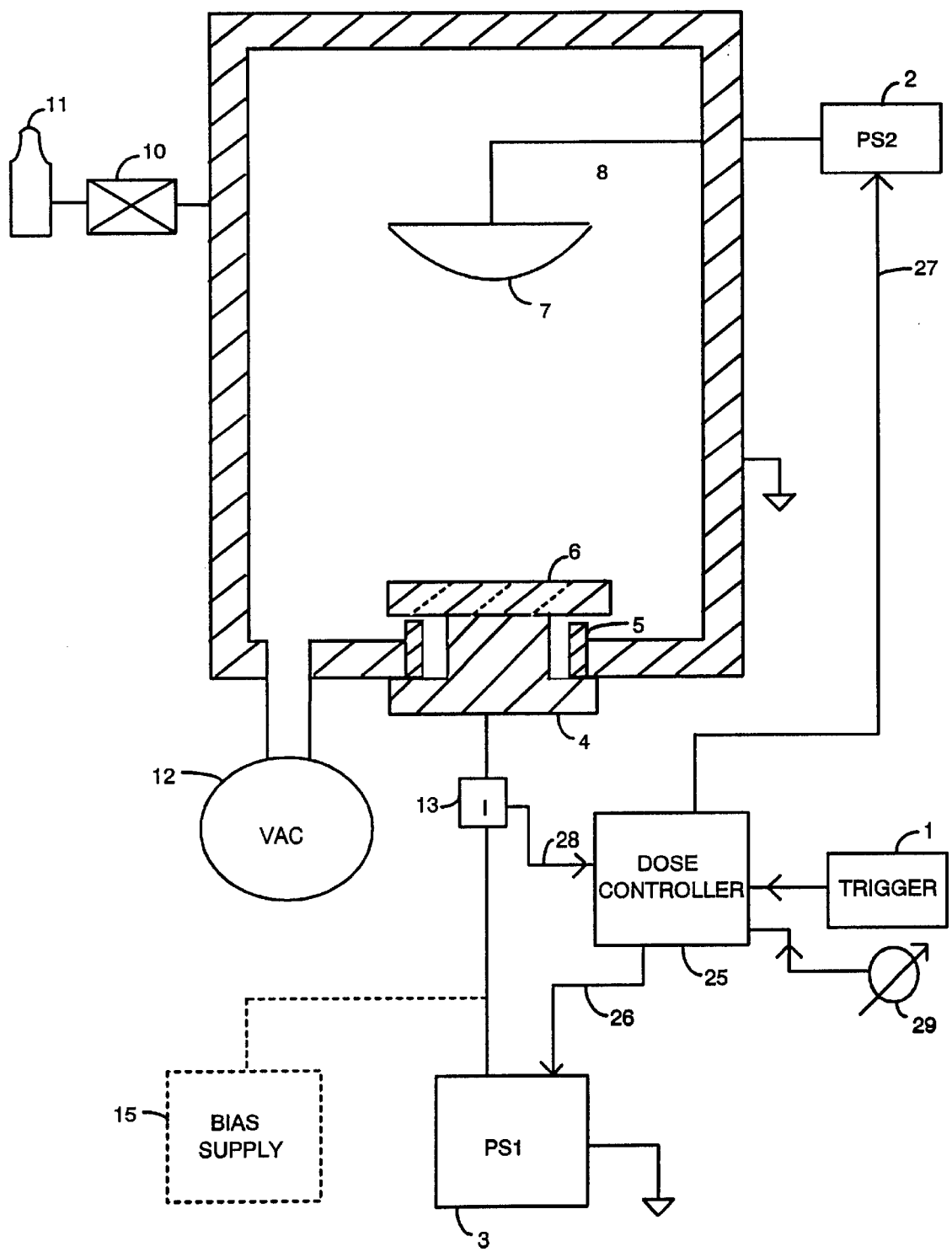
FIG. 2 is a more detailed block diagram of the inventive $PI^3$ system including an automatic dose controller FIGS. 3(a) 3(b), 3(c) and to 3(d) are timing diagrams with FIGS. 3(a) and 3(b) being illustrative of the preferred relationship of the first cathode voltage pulse and the second cathode voltage pulse.

It has been determined that many of the larger particles which had formed using continuous ionization are negatively charged. By using a small negative bias from Bias Supply 15, it is possible to deflect those negatively charged ions from reaching the wafer as shown in FIG. 2. With reference to FIG. 2, the current sensor 13 is connected to dose controller 25. In this embodiment, the dose controller, responsive to dose selection 29, can measure the progress during implantation and shut down power supplies 2 and 3 when the desired dose is achieved.

Figure 3:
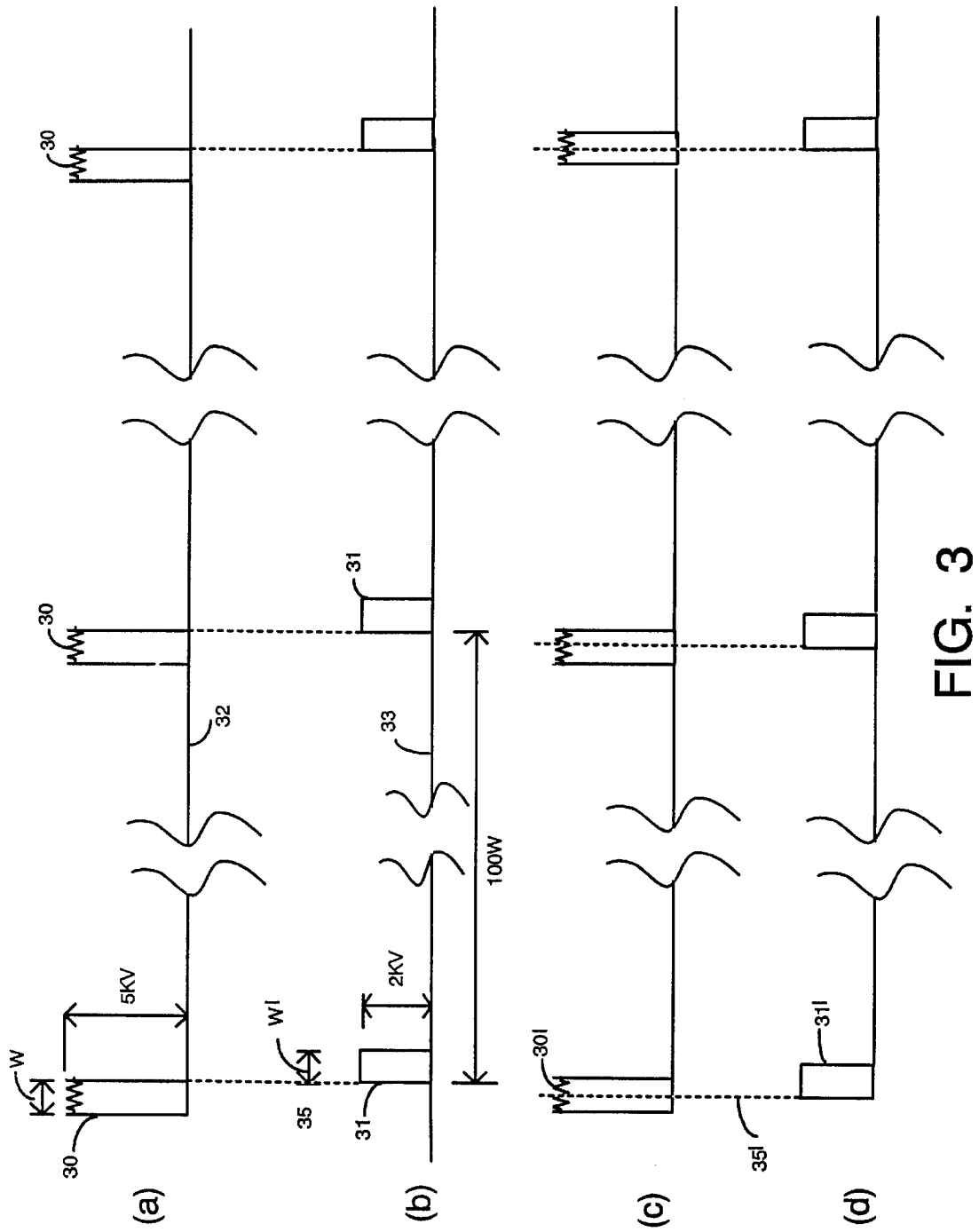

With reference to FIG. 3(a) and FIG. 3(b), the voltage pulses 30 from PS1 are shown followed immediately by a voltage pulse train 31 from PS2. The pulse width W of the pulse train 30 is preferably 1–30 microseconds and the pulse period is on the order of 100 W. The pulse width W' of the PS2 pulse is on the same order. Both pulses 30 and 31, are shown in positive format for convenience of illustration. The best manufactured yield from the standpoint of repeatable percentage of good devices/total devices has been obtained when the pulse 31 follows immediately after pulse 30 ends. However, as shown in FIGS. 3(c) and 3(d), pulses 30' and 31' can overlap in time so that the electrons are neutralizing the dielectric simultaneous with the ion implant. For reasons which are not understood, although some of the benefits of the invention are obtained, the yield of acceptable devices is not as high or as repeatable with such overlapping pulses.

The cold cathode 7 has been selected of a non-contaminating material or is clad with such a material. I prefer high purity amorphous carbon, although Ni is also acceptable because it is inert in fluorine plasma. The geometry of the electrode 7 surface is also important. Efficiency of electron emission by methods of surface roughening has been found useful for increasing the electron flooding density. A generally concave outer surface provides more surface area than a planar device and may be preferred for providing more uniform field lines at the wafer surface.

After anneal of an implanted wafer, we have demonstrated sheet resistance of 130 to 1 K ohms/square, preferably of 150 ohms/square and a junction depth of about 900 Å. Also the particle count is less than 1 particle/cm$^2$ in a non-clean room environment (0.3→2.5 μm particle diameter). For comparison, the *particles count for the $BF_3$ ECR process was several orders of magnitude higher.

Since PS1 and PS2 are inductive power supplies, it is impossible to turn off the pulse current instantly. This complicates the ability of the dose controller to determine the ion dose which has been implanted. So long as the ion implantation voltage pulse is less than 10 KV, secondary electrons produced at the wafer surface of silicon are less than 3%. Accordingly, with PS1 turned off, the current pulse waveform measured by sensor 13 is of the form illustrated in FIG. 4(a). This waveform comprises a region 41 in which current indicates positive ion flow to the surface of the wafer 6 in response to the pulses from PS2. Also seen in FIG. 4(a) waveform is a region 42 in which a current is indicated which is due to the inability of the current to instantaneously stop due to the flux linkages from the inductively produced current from the power supply. In order to measure the dose of the positive ions, it is necessary to eliminate the portion 42 of the waveform 40 which is not due to the positive ion current. With this goal in mind, applicant has provided a circuit to convert the sensed current waveform 40 into a waveform 44 which tracks the rise and fall time of the pulse 41 but completely eliminates the opposite polarity portion 42 as seen in the region 43. Having produced the waveform 44, it is now possible to integrate each pulse 36 to reach a measure of the total ion implantation, i.e. dose as a function of time.

Figure 5:
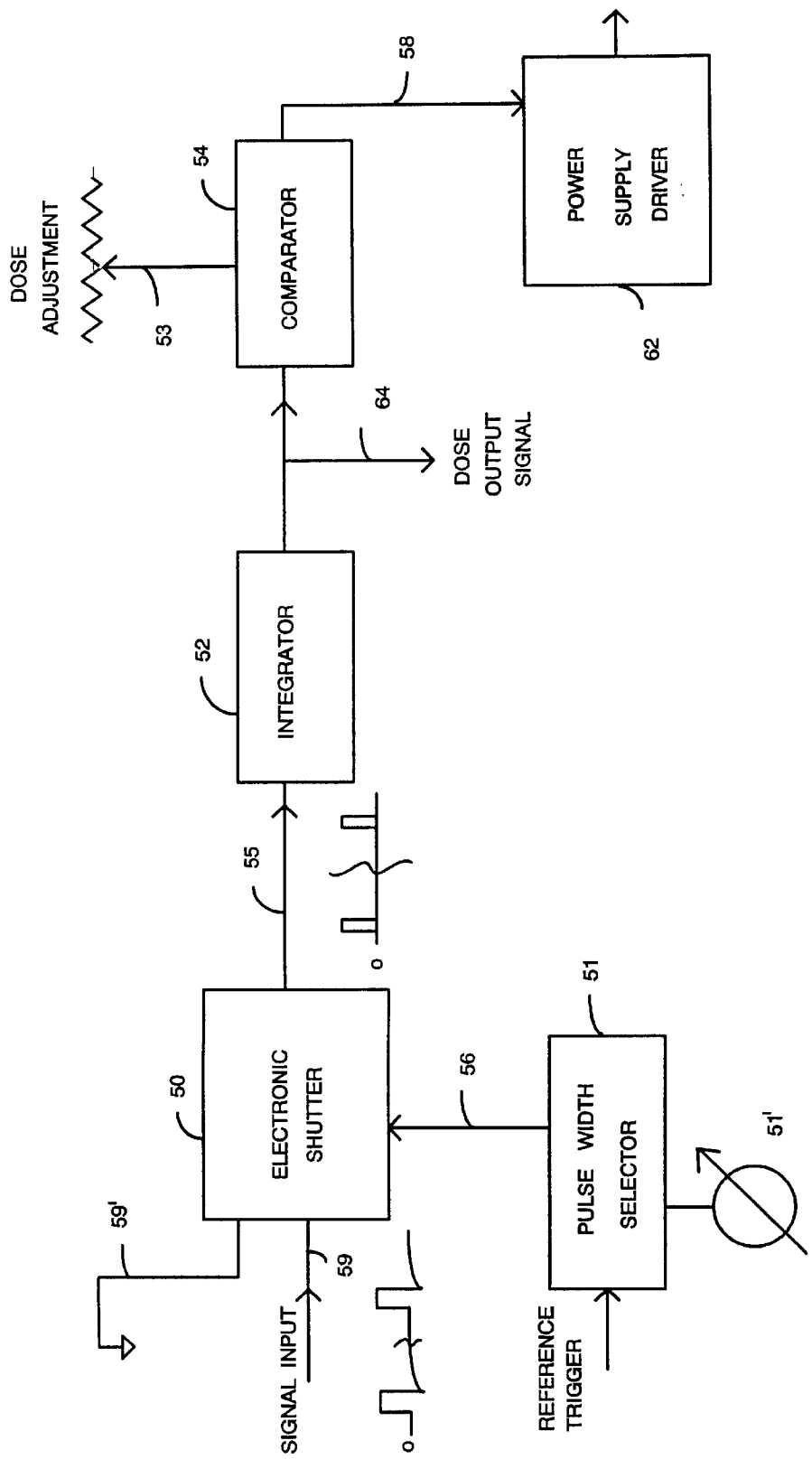
FIG. 5 is a block schematic diagram of the dose controller.

The block diagram of FIG. 5 is illustrative of the dose control circuit elements. The input 59 is a current waveform having two polarities with respect to ground. The signal 59 is received by an electronic shutter 50.

Also connected to the electronic shutter is a pulse width selector 51 which has a manual pulse width adjuster 51. Connected to the pulse width selector 51 is a Reference Trigger from Trigger Generator 1. There are many different circuits which can accomplish the desired pulse shutter function. The circuit described below is one alternative but many other circuits are possible.

Figure 4:
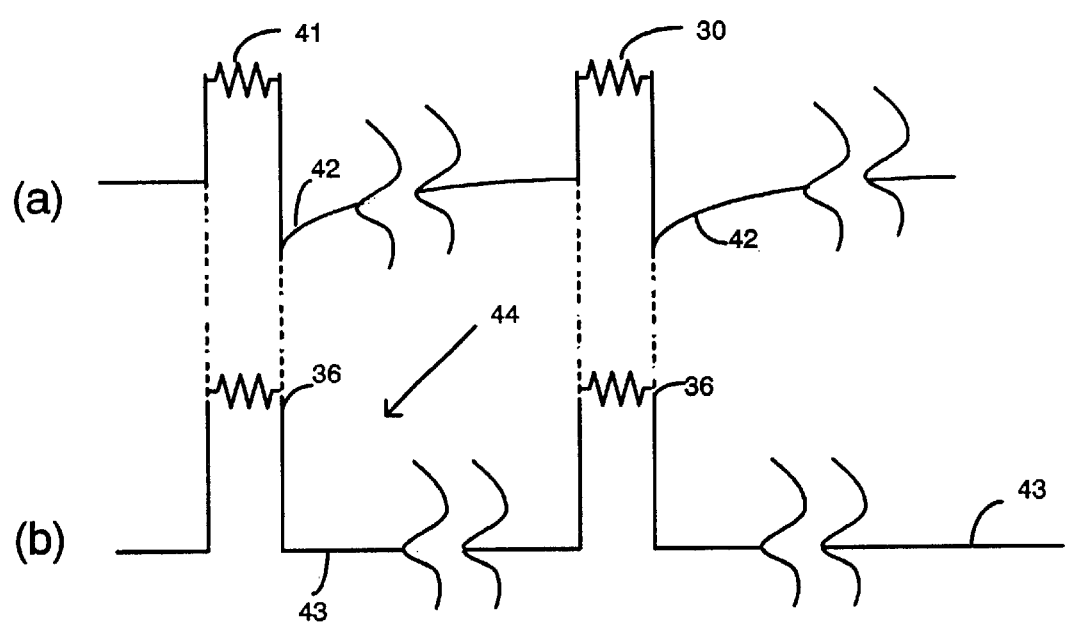
FIG. 4(a) is illustrative of the current measured in a series current sensor in the first cathode circuit.
FIG. 4(b) is the first cathode current after deletion of the negative portion in FIG. 4(a).

When the pulse width from pulse width selector 51 is exactly the same width as the positive portion 41 of FIG. 4(*a*), the output of the shutter 50 will switch to ground and have the negative portion 42 removed and the signal 55 into the integrator 52 will be as shown in FIG. 4(*b*). The output 64 of the integrator 52 is available as an indicator of the dose and is provided to the comparator 54. The comparator 54 accepts selection adjustment 53 to establish a stable voltage dose adjustment as a reference level. When the analogue integrated voltage 64 exceeds the reference 53, the comparator 58 sends a signal 58 to turn off the power supply 3 and end the implantation of the workpiece.

Figure 6:
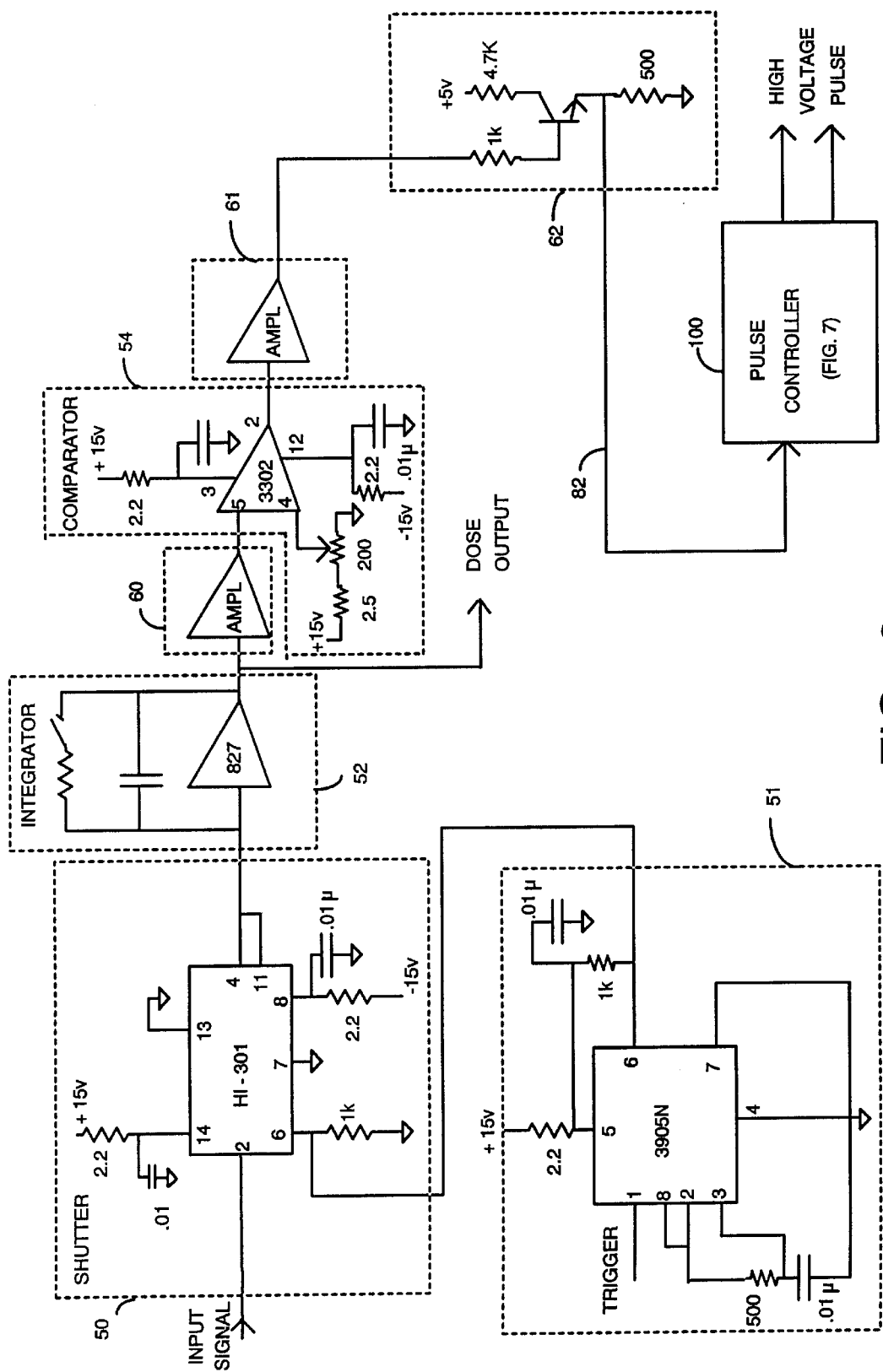
FIG. 6 is schematic diagram of a preferred dose controller.
Figure 6A:
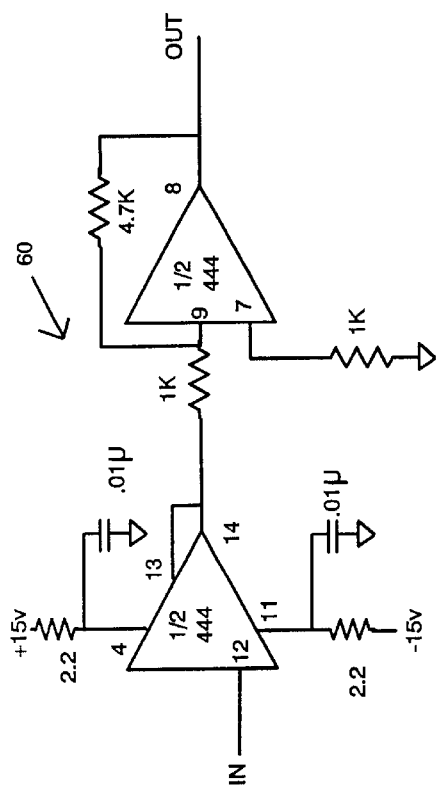
FIG. 6(a) is schematic of an illustrative amplifier of FIG. 6.
Figure 6B:
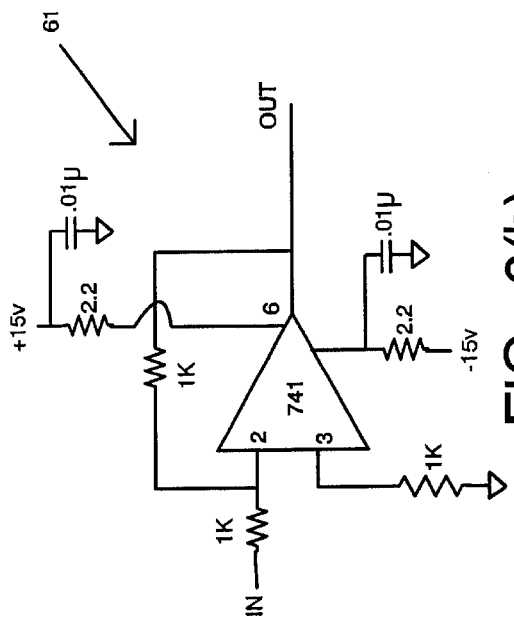
FIG. 6(b) is a schematic of another amplifier of FIG. 6.
Figure 6C:
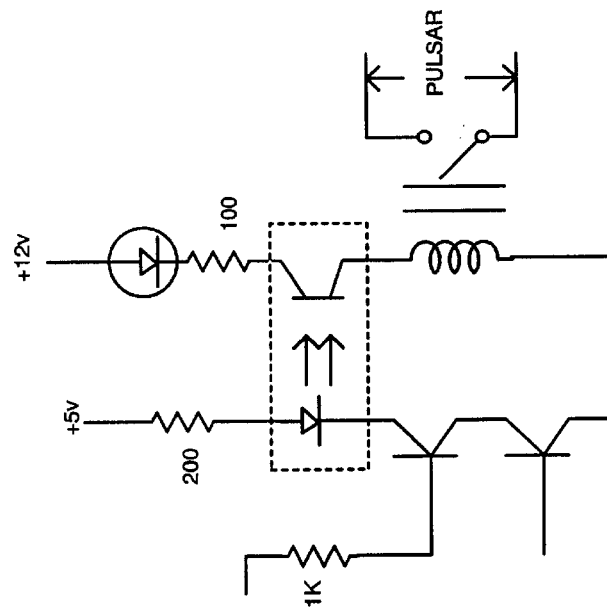
FIG. 6(c) is a schematic of the high voltage pulse control circuit of FIG. 6.
Figure 6D:
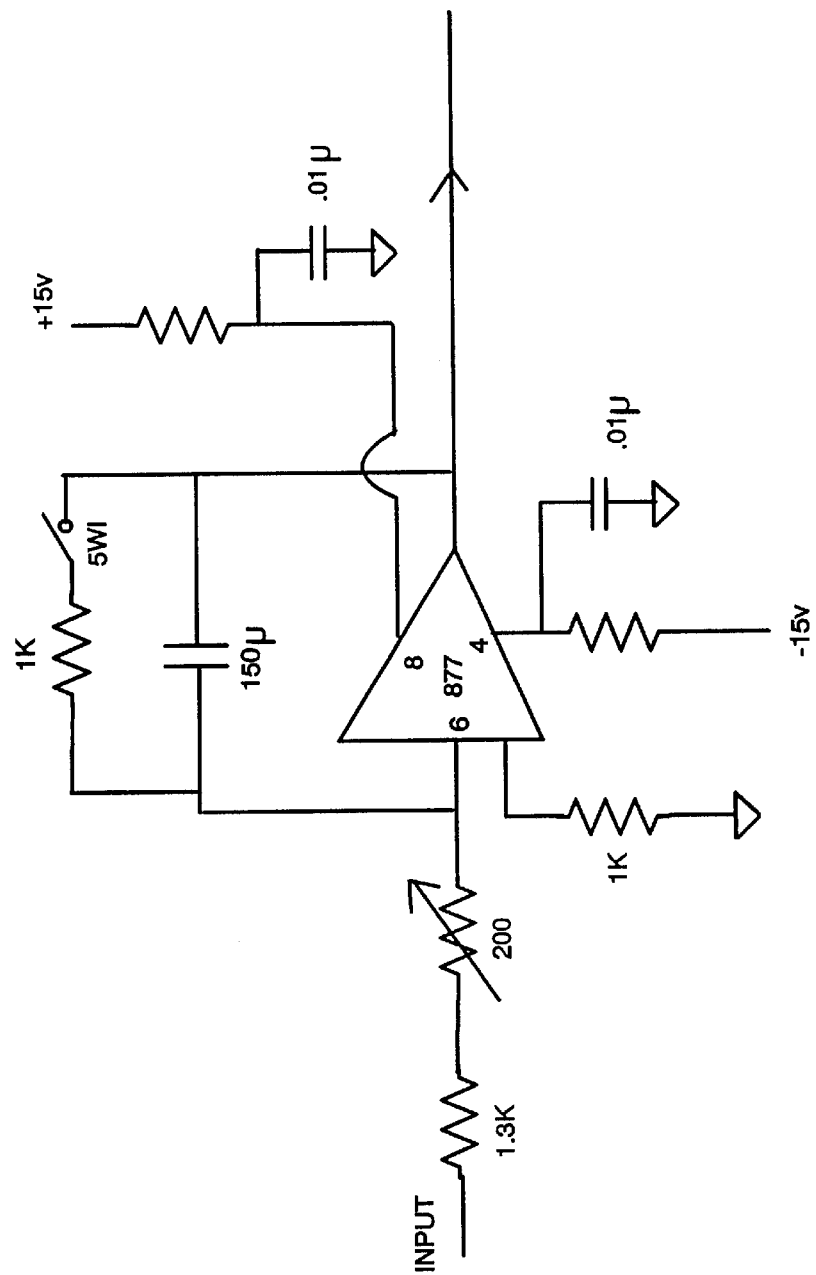
FIG. 6(d) is the schematic of the integrator circuit of FIG. 6.

With reference to FIG. 6, circuits are shown in detail which can carry out the functions of the block diagram of FIG. 5. Timer 51 using a trigger circuit is based on a 3905N chip manufactured by National Semiconductor Corporation. The adjustable 500 ohm resistor connected between pins 2 and 3 is a 30 turn precision resistor. This circuit is a timer circuit in which the RC time constant determines the on time. Other circuits such as standard one-shot multivibrator circuits would satisfy this requirement.

The pulse out on pin 6 of the 3905N chip is connected to pin 6 of the HI-301 chip made by Harris Corporation. The HI-301 is a very fast switch circuit which passes the input signal on pin 2 to the output pin 4 as long as the pin 6 input is high and when pin 6 goes low, the pin 4 output goes to the signal on pin 7 which is grounded. Using an oscilloscope to manually adjust the "on time" of timer 51, we have adjusted the shutter switching time very easily within 1.0 microseconds of the pulse off time of pulser voltage.

The output from pin 4 of HI-301 is connected to an integrator circuit 52 connected around an OP-AMP 827 made by Analog Devices. A manual switch SWI is connected in the feedback to provide a selection of time constants. The integrator is more fully depicted in FIG. 6(*d*).

Figure 7:
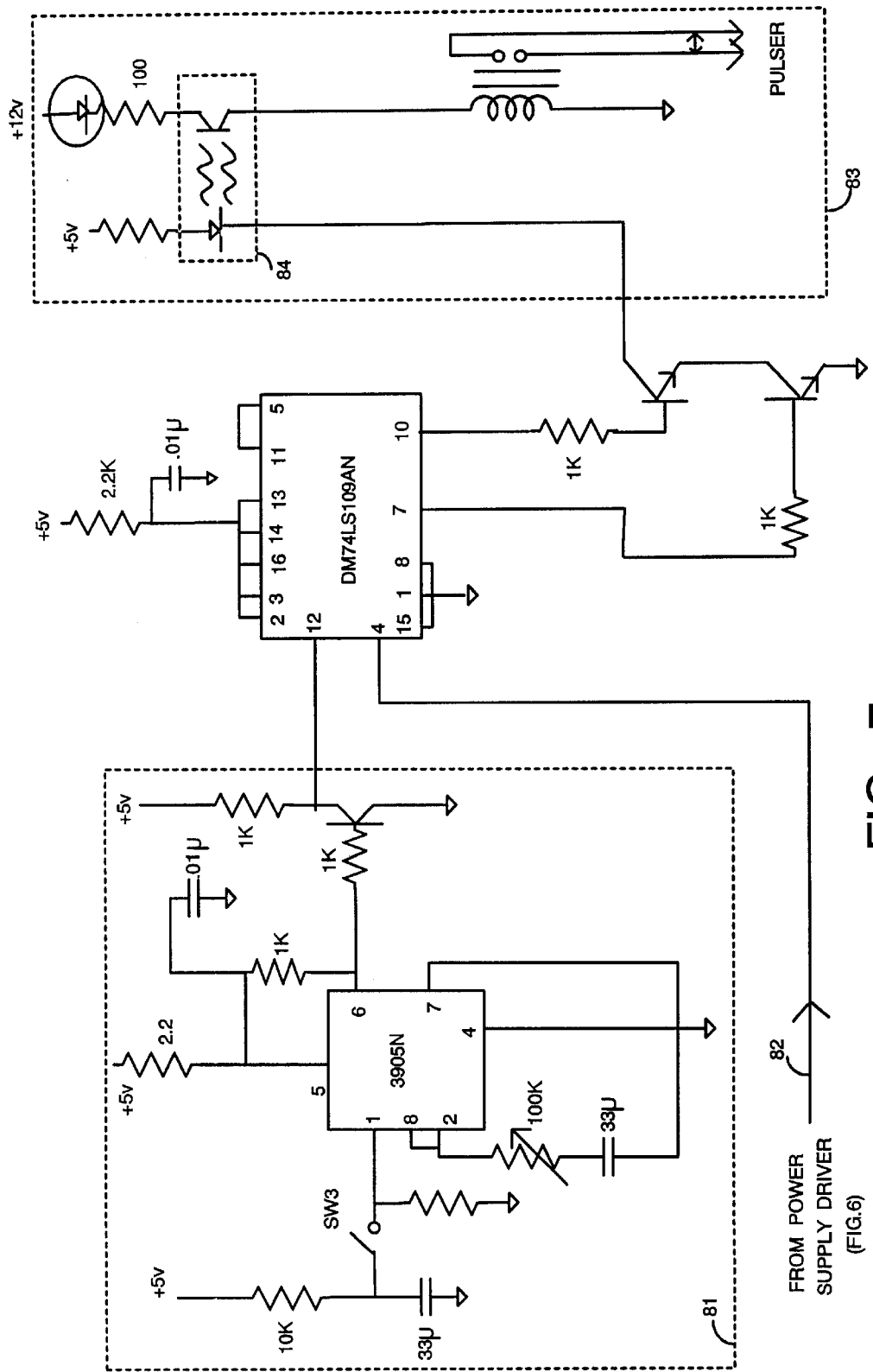
FIG. 7 is a schematic of the pulser control circuit of FIG. 6.

Amplifier 60 is more fully described in FIG. 6(*a*) and is a voltage follower on a single 444 chip made by National Semiconductor Corporation. The amplifier output of circuit 60 is connected to the comparator circuit 54. Comparator circuit 54 provides an output on pin 2 of the 3302 chip made by Motorola which switches between 5 V and ground depending on the level of the two inputs pins 5 and 4. Since the voltage at pin 4 is selectable by adjusting the 200 ohm potential divider connected to pin 4, the user is able to adjust the dose level at which the comparator output switches. The comparator 54 output is connected to a voltage follower 61 which can drive any control circuit to shut down the high voltage pulse generator in desired sequence. An example is the power supply driver circuit 62 more fully described in FIG. 6(*b*). The power supply driver 62 is connected to pulse controller 100 which is more fully described in FIG. 7. A timer 81 is connected to a DM74L5109AN chip made by National Semiconductor Corporation for driving the Pulse Generator 83 through the opto isolator 84. Pulse Generator 83 is Model 350 made by Velonix Inc., San Diego, Calif.

It is understood that the present invention is not limited to the particular embodiments set forth herein but embraces all such modified forms which come with the scope of the following claims.

What is claimed is:

1. A process for implanting ions into a semiconductor wafer, the process comprising:
   supporting the semiconductor wafer on a first electrode in a chamber;
   injecting a gas into the chamber, the gas comprising dopants to be implanted into the semiconductor wafer;
   sequentially providing a plurality of first voltage pulses to the first electrode, each of the first voltage pulses being direct current (DC) voltage pulses less than 10 kV in magnitude, each of the first voltage pulses simultaneously ionizing the gas to create a plasma adjacent to said semiconductor wafer and accelerate and implant ions from the plasma into the semiconductor wafer; and
   removing all plasma-inducing electric fields after each of the first voltage pulses to extinguish the plasma between each of the first voltage pulses.

2. The process of claim 1 wherein the gas comprises $BF_3$ and the first voltage pulses form the plasma by creating secondary emission electrons that strip electrons from $BF_3$ gas molecules.

3. The process of claim 2 wherein each of the first voltage pulses has a duration on the order of 10 microseconds.

4. The process of claim 3 wherein the plurality of first voltage pulses has a duty cycle on the order of one (1) percent.

5. The process of claim 1, wherein each of the first voltage pulses has a pulse width in a range of 1 to 30 microseconds.

6. A process for implanting ions into a semiconductor wafer, the process comprising:
   supporting the semiconductor wafer on a first electrode in a chamber;
   injecting a gas into the chamber, the gas comprising dopants to be implanted into the semiconductor wafer; and
   providing first voltage pulses to the first electrode, the first voltage pulses being direct current (DC) voltage pulses less than 10 kV in magnitude that ionize the gas to create a non-continuous plasma at a surface of the semiconductor wafer and accelerate and implant ions from the non-continuous plasma into the surface, the first voltage pulses being of sufficiently short duration so as not to contribute to formation of particles that deposit on the surface.

7. The process of claim 6 wherein the gas comprises $BF_3$, and the first voltage pulses form the non-continuous plasma by stripping electrons from $BF_3$ gas molecules, and wherein a negative sheath voltage forms atop the first electrode and accelerates positive plasma ions toward the first electrode.

8. The process of claim 7 wherein the $BF_3$ gas has a pressure on the order of one (1) milliTorr.

9. The process of claim 6 further comprising applying a negative bias voltage to the semiconductor wafer to deflect negatively charged particles from the surface.

10. The process of claim 6, wherein the first voltage pulses have a pulse width in a range of 1 to 30 microseconds.

11. A process for implanting ions into a semiconductor wafer, said process comprising steps of:
   supporting said semiconductor wafer on a first electrode in a chamber, said first electrode being electrically connected to a first pulsed voltage source;
   providing first voltage pulses to said first electrode, said first voltage pulses being less than 10 kV in magnitude and that induce formation of a non-continuous plasma at a surface of said semiconductor wafer and accelerate ions from said non-continuous plasma into said semiconductor wafer surface, said first voltage pulses being of sufficiently short duration so as not to contribute to formation of particles which deposit on said semiconductor wafer surface; and
   providing a flow of neutralizing electrons to said semiconductor wafer surface to neutralize charge built up thereon, thereby avoiding surface charge induced damage, said step of providing the flow of neutralizing electrons comprising steps of:

provide a cold cathode electron source in said chamber, said source being electrically connected to a second pulsed voltage source; and pulsing said cold cathode electron source with second voltage pulses, said second voltage pulses being timed to said first voltage pulses.

12. The process of claim 11 wherein said second voltage pulses are switched on when said first voltage pulses are switched off.

13. The process of claim 11 wherein said surface materials from said wafer include at least a dielectric material, and wherein said step of providing neutralizing electrons to said wafer surface avoids surface charge build up that would otherwise cause electric field induced dielectric breakdown which is damaging to said surface.

14. A process for implanting ions into a semiconductor wafer having a surface, said process comprising steps of:

supporting said semiconductor wafer on a first electrode in a chamber having an ionizable gas therein, said first electrode being electrically connected to a voltage source;

sequentially providing a plurality of first voltage pulses to said first electrode, each of said first voltage pulses being less than 10 kV in magnitude and creating within a vicinity of said semiconductor wafer surface a plasma having ions, and after producing said plasma having ions, each said first voltage pulse accelerating said ions into said semiconductor wafer surface;

removing all plasma inducing electric fields after each said first voltage pulse so that said plasma is extinguished between said first voltage pulses;

providing a cold cathode electron source in said chamber, said cathode electron source being electrically connected to a second pulsed voltage source; and sequentially providing a plurality of second voltage pulses to said cold cathode electron source to provide a pulsed flow of electrons to said semiconductor wafer surface which neutralizes charge built up on said surface of said semiconductor wafer, said second voltage pulses being timed with said first voltage pulses.

15. The process of claim 14 wherein said second voltage pulses are switched on when said first voltage pulses are switched off.

16. A method of treating a workpiece comprising steps of:

inserting the workpiece into an interior of a treatment chamber and supporting the workpiece on a conductive workpiece support such that a treatment surface of the workpiece faces a treatment region in the interior of the treatment chamber, the treatment chamber having a conductive wall portion that bounds the interior of the treatment chamber;

injecting a treatment material comprising neutrally uncharged gas molecules into the treatment chamber such that the gas molecules occupy the treatment region; and repeatedly relatively biasing the conductive workpiece support and the conductive wall portion of the treatment chamber by applying D.C. voltage pulses less than 10 KV in magnitude to ionize the gas molecules injected into the treatment chamber and to accelerate and implant resulting charged particles into the workpiece.

17. The method of claim 16, wherein the step of repeatedly relatively biasing the active workpiece support comprises a step of repeatedly negatively biasing the conductive workpiece support with respect to the conductive wall portion of the treatment chamber to ionize the gas molecules injected into the treatment chamber and to accelerate and implant resulting positively charged ions into the workpiece.

18. The method of claim 16, wherein the step of repeatedly relatively biasing the conductive workpiece support comprises a step of applying D.C. voltage pulses to the conductive workpiece support while maintaining the conductive wall portion at a reference electric potential.

19. An apparatus for treating a workpiece comprising:

a treatment chamber defining a chamber interior and having a conductive wall portion that bounds the chamber interior;

a conductive workpiece support for supporting the workpiece in the chamber interior of the treatment chamber;

an injector for injecting a treatment material comprising gas molecules into the treatment chamber such that the gas molecules occupy a treatment region proximal to the workpiece supported by the conductive workpiece support; and control circuitry for repeatedly relatively biasing the conductive workpiece support and the conductive wall portion of the treatment chamber, the control circuitry comprising a voltage source for providing a sequence of D.C. voltage pulses less than 10 KV in magnitude that both ionize the gas molecules injected into the treatment chamber and accelerate and implant resulting charged particles into the workpiece.

20. The apparatus of claim 19, wherein the control circuitry repeatedly negatively biases the conductive workpiece support with respect to the conductive wall portion of the treatment chamber to ionize the gas molecules injected into the treatment chamber and to accelerate and implant resulting positively charged ions into the workpiece.

21. The apparatus of claim 19, wherein the voltage source applies D.C. voltage pulses to the conductive workpiece support and wherein the control circuitry maintains the conductive wall portion at a reference electric potential.

* * * * *

UNITED STATES PATENT AND TRADEMARK OFFICE
CERTIFICATE OF CORRECTION

PATENT NO.    : 6,632,482 B1                                    Page 1 of 1
DATED         : October 14, 2003
INVENTOR(S)   : Terry T. Sheng It is certified that error appears in the above-identified patent and that said Letters Patent is hereby corrected as shown below:

<u>Title page, Item [54] and Column 1, line 1,</u>
Title, "IMMERSION" should be deleted.

<u>Column 2,</u>
Line 21, "DRAWING" should be -- DRAWINGS --;
Line 27, "3(a) 3(b)," should be -- 3(a), 3(b),- --; "to" should be deleted;
Line 52, "employ" should be -- employs --; "so called" should be -- so-called --.

<u>Column 3,</u>
Line 43, "voltage" should be -- voltage, --;
Line 44, "KV;" should be -- KV, --;

<u>Column 4,</u>
Line 32, "*particles" should be -- particle --.

Signed and Sealed this

Twentieth Day of January, 2004

JON W. DUDAS
*Acting Director of the United States Patent and Trademark Office*